United States Patent
Lee et al.

(10) Patent No.: US 10,580,990 B2
(45) Date of Patent: Mar. 3, 2020

(54) COMPOSITE POLYMER SEMICONDUCTOR USING CONJUGATED POLYMER AND INSULATOR POLYMER, AND METHOD FOR PRODUCING SAME

(71) Applicant: GWANGJU INSTITUTE OF SCIENCE AND TECHNOLOGY, Gwangju (KR)

(72) Inventors: Kwanghee Lee, Gwangju (KR); Kilho Yu, Gwangju (KR); Byoungwook Park, Gwangju (KR)

(73) Assignee: GWANGJU INSTITUTE OF SCIENCE AND TECHNOLOGY (KR)

( * ) Notice: Subject to any disclaimer, the term of this patent is extended or adjusted under 35 U.S.C. 154(b) by 0 days.

(21) Appl. No.: 16/317,819

(22) PCT Filed: Jul. 13, 2017

(86) PCT No.: PCT/KR2017/007456
§ 371 (c)(1),
(2) Date: Jan. 14, 2019

(87) PCT Pub. No.: WO2018/012875
PCT Pub. Date: Jan. 18, 2018

(65) Prior Publication Data
US 2019/0237671 A1    Aug. 1, 2019

(30) Foreign Application Priority Data
Jul. 13, 2016    (KR) ........................ 10-2016-0088444

(51) Int. Cl.
*H01L 51/00* (2006.01)
*B32B 5/02* (2006.01)
(Continued)

(52) U.S. Cl.
CPC .......... *H01L 51/0036* (2013.01); *B32B 5/028* (2013.01); *B32B 27/12* (2013.01); *B32B 27/28* (2013.01); *B32B 27/302* (2013.01); *C08L 25/06* (2013.01); *C08L 65/00* (2013.01); *H01L 51/0035* (2013.01); *H01L 51/0043* (2013.01);
(Continued)

(58) Field of Classification Search
None
See application file for complete search history.

(56) References Cited

U.S. PATENT DOCUMENTS

2005/0280020 A1    12/2005    Heeger et al.

FOREIGN PATENT DOCUMENTS

| JP | 3776571 B2 | 5/2006 |
| KR | 20100070652 A | 6/2010 |

(Continued)

*Primary Examiner* — Jack S Chen
(74) *Attorney, Agent, or Firm* — Renaissance IP Law Group LLP

(57) ABSTRACT

Provided are: a composite polymer semiconductor having a mesh shape formed by mixing a conjugated polymer and an insulating polymer; and a method for producing same. A composite polymer having a mesh structure is produced by introducing a small quantity of a conjugated polymer to an insulating polymer. The produced composite polymer having a mesh structure increases charge mobility, minimizes visible light absorption through the introduction of the small quantity of the conjugated polymer, and thus can be used as a transparent and flexible organic electronic element.

3 Claims, 9 Drawing Sheets

(51) Int. Cl.
*B32B 27/12* (2006.01)
*B32B 27/30* (2006.01)
*B32B 27/28* (2006.01)
*C08L 25/06* (2006.01)
*C08L 65/00* (2006.01)
*H01L 51/05* (2006.01)
*H01L 51/50* (2006.01)
*H01L 27/32* (2006.01)

(52) U.S. Cl.
CPC ............. *H01L 51/05* (2013.01); *H01L 51/50* (2013.01); *B32B 2260/021* (2013.01); *B32B 2260/046* (2013.01); *B32B 2307/202* (2013.01); *B32B 2307/206* (2013.01); *B32B 2457/00* (2013.01); *C08L 2203/20* (2013.01); *C08L 2205/16* (2013.01); *H01L 27/3274* (2013.01); *H01L 51/0566* (2013.01)

(56) References Cited

FOREIGN PATENT DOCUMENTS

| | | |
|---|---|---|
| KR | 20120060428 A | 6/2012 |
| KR | 20140103534 A | 8/2014 |
| KR | 101730389 B1 | 4/2017 |

COMPOSITE POLYMER SEMICONDUCTOR USING CONJUGATED POLYMER AND INSULATOR POLYMER, AND METHOD FOR PRODUCING SAME

TECHNICAL FIELD

The present invention relates to a structure of a composite polymer semiconductor structure and a method of producing the same, and more particularly, to a composite polymer semiconductor formed by mixing a conjugated polymer with an insulating polymer, and a method of producing the same.

BACKGROUND ART

With the advent of the ubiquitous age, there has been a rapid increase in demand and interest for new devices such as flexible and transparent displays, wearable devices, and the like. As research and development is actively carried out on new electronic devices, organic materials which are inexpensive, applicable to a solution process, and light in weight and flexible are being studied as next generation semiconductors. Research has been carried out on materials based on the existing inorganic materials, so organic polymer semiconductors provide various probabilities as electronic materials. However, the organic polymer semiconductors produced by a solution process have irregular molecular structures and thus most of the organic polymer semiconductors have electrical performances that are much lower than those of the existing inorganic semiconductors.

In order to solve such problems of the organic polymer semiconductors, a high temperature heat treatment method and a molecular alignment method using a nano-structure have been studied, but these methods are not suitable for commercialization because mass production is impossible. Further, there is a problem to be solved in that it is difficult to apply the existing organic polymer semiconductors on various plastic substrates.

DISCLOSURE

Technical Problem

The present invention is directed to providing a structure of a composite polymer semiconductor, which has a mesh shape in which a conjugated polymer and an insulating polymer are bonded, for a transparent and flexible organic electronic device.

The present invention is also directed to providing a method of producing a composite polymer.

Technical Solution

One aspect of the present invention provides a composite polymer semiconductor including an insulating polymer layer configured to form a matrix and a conjugated polymer layer coexisting with the insulating polymer layer and formed with a fiber structure having a regular molecular arrangement in a mesh shape.

The conjugated polymer layer may be made of DPP2T, and the insulating polymer layer may be made of polystyrene (PS).

The insulating polymer layer and the conjugated polymer layer may be mixed with a mass ratio (%) in the range of 70:30 to 95:5 and may be thin-filmed through a solution process.

The thin-filmed composite polymer may have transmittance in the range of 95% to 99%.

Another aspect of the present invention provides a method of producing a composite polymer, the method including mixing a first insulating polymer and a second conjugated polymer and forming a third composite polymer having a mesh shape by mixing the first insulating polymer with the second conjugated polymer.

In the mixing of the first insulating polymer with the second conjugated polymer, the first insulating polymer may be polystyrene (PS).

In the mixing of the first insulating polymer with the second conjugated polymer, the second conjugated polymer may be DPP2T.

In the forming of the third composite polymer having the mesh shape, the third composite polymer may be produced by mixing the first insulating polymer and the second conjugated polymer with a mass ratio in the range of 70:30 to 95:5.

Advantageous Effects

In accordance with a composite polymer semiconductor having a mesh shape in which a conjugated polymer and an insulating polymer are bonded and a method of producing the same, a solution process is used and a mesh structure is formed such that a produced composite polymer can have high charge mobility.

Further, a small amount of conjugated polymer is introduced into the insulating polymer such that a transparent and flexible organic electronic device is produced by minimizing absorption of visible light. The produced composite polymer is a transparent and flexible organic electronic device such that high economic feasibility can be achieved.

It should be noted that effects of the present invention are not limited to the above-described effects, and other effects of the present invention not mentioned above can be clearly understood by those skilled in the art from the following descriptions.

MODES OF THE INVENTION

Figure 1A:
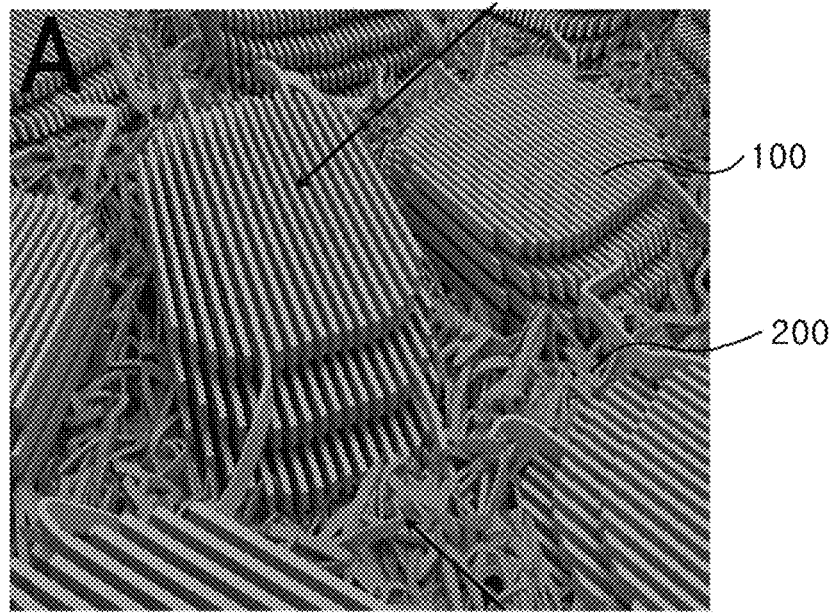
FIGS. 1A and 1B show schematic photographs showing molecular arrangement structures of a conjugated polymer and a produced composite polymer according to one embodiment of the present invention.

Hereinafter, exemplary embodiments of the present invention will be described in detail with reference to the accompanying drawings.

The exemplary embodiments of the present invention may be modified in various other forms, and the scope of the present invention is not limited to the exemplary embodiments described below. Further, these embodiments are provided to more fully describe the present invention to those skilled in the art. Therefore, shapes and sizes of components in the drawings may be exaggerated for clarity, and components denoted by the same reference numerals in the drawings are the same components.

Embodiment

FIG. 1 shows schematic photographs showing molecular arrangement structures of a conjugated polymer and a produced composite polymer according to one embodiment of the present invention.

Referring to FIG. 1, the photographs showing the molecular arrangement structures of the conjugated polymer and the produced composite polymer are disclosed.

A substrate is prepared.

Subsequently, a composite polymer layer which is thin-filmed through a solution process is formed.

The thin-filmed composite polymer layer is made of an insulating polymer layer forming a matrix and a conjugated polymer layer coexisting with the insulating polymer layer and formed in a mesh shape as a fiber structure with a regular molecular arrangement. Further, the substrate may be made of a transparent and flexible polyethylenenaphthalate (PEN) substrate. Furthermore, the composite polymer layer formed on the substrate may have a mesh shape. The composite polymer layer may be formed as a thin film by mixing polystyrene (PS) and DPP2T with a mass ratio (%) in the range of 70:30 to 95:5.

FIG. 1A is a photograph showing a molecular arrangement structure of an original conjugated polymer.

In DPP2T conjugated polymers 100 and 200, a region of DPP2T conjugated polymer 100 having a regular molecular arrangement and a region of DPP2T conjugated polymer 200 having an irregular molecular arrangement are mixed.

Figure 1B:
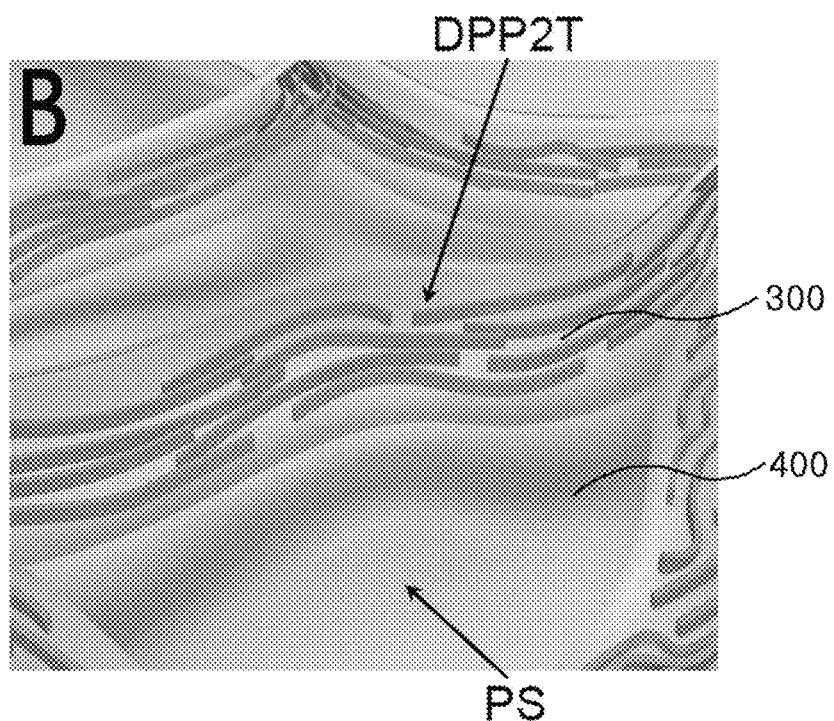

Meanwhile, FIG. 1B is a photograph showing a molecular arrangement structure of the thin-filmed composite polymer layer.

The produced composite polymer layer is formed in a mesh structure. The mesh structure formed on the composite polymer layer is constituted with an insulating polymer layer 400 forming a matrix and a conjugated polymer layer 300 coexisting with the insulating polymer layer 400 and formed in a mesh shape as a fiber structure with a regular molecular arrangement. The conjugated polymer layer 300 may be formed of DPP2T, and the insulating polymer layer 400 may be formed of PS.

Figure 2:
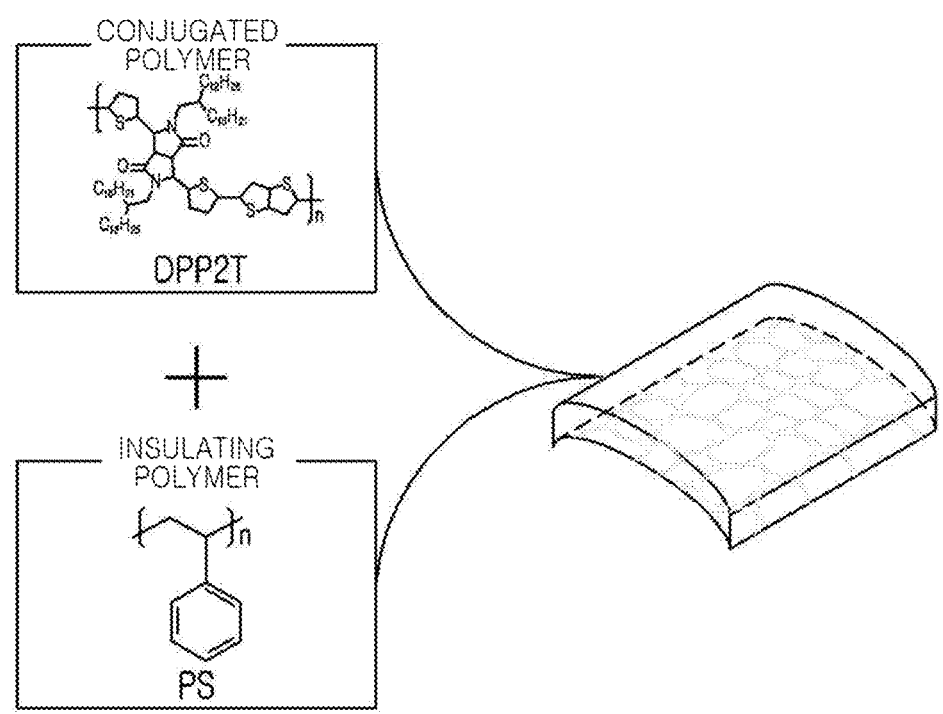
FIG. 2 is a diagram for describing the composite polymer according to one embodiment of the present invention.

FIG. 2 is a diagram for describing the composite polymer according to one embodiment of the present invention.

Referring to FIG. 2, a method of producing a composite polymer is disclosed.

A first polymer is prepared. The first polymer may be a styrene substituted polymer and may include PS, poly(α-methyl styrene) (PαMS), poly(4-methyl styrene) (P4MS), poly(2-vinylnaphthalene) (PVN), poly(4-vinyl phenol) (PVP), poly(2-vinyl pyridine) (PVPyr), or polyvinyl alcohol (PVA), but the present invention is not limited thereto. In addition, the first polymer may be one selected from various polymers such as polypropylene, poly(methylmethacrylate) (PMMA), poly(vinylacetate) (PVAc), fluoropolymer (Teflon), parylene, polyimide, polycarbonate, poly(vinylphenol) (PVP), polyacetal, polyoxymethylene, polyamide, and the like, but the present is not limited thereto. However, the first polymer may be PS.

The first polymer and a second polymer are mixed. The second polymer may be one selected from among polyacetylene, polyaniline, polypyrrole, polythiophene, and a poly sulfur nitride polymer, but the present invention is not limited thereto. However, the second polymer may be DPP2T.

The first polymer and the second polymer may be mixed with the mass ratio (%) in the range of 70:30 to 95:5.

The first polymer and the second polymer are mixed to form a third polymer.

The third polymer may form a thin film on the substrate by a solution process. The third polymer thin-filmed on the substrate forms a mesh structure. Further, the substrate may employ a glass substrate or a plastic substrate. In this case, an organic insulator applicable to a low-temperature solution process may be used. For example, the organic insulator may be applied on plastic substrates such as polycarbonate, polysulfone, polyethersulfone, and the like. In particular, the substrate may employ a PEN substrate made of a flexible material.

FIG. 3 shows graphs showing absorbance and transmission spectra of the conjugated polymer and the composite polymer according to one embodiment of the present invention.

Figure 3A:
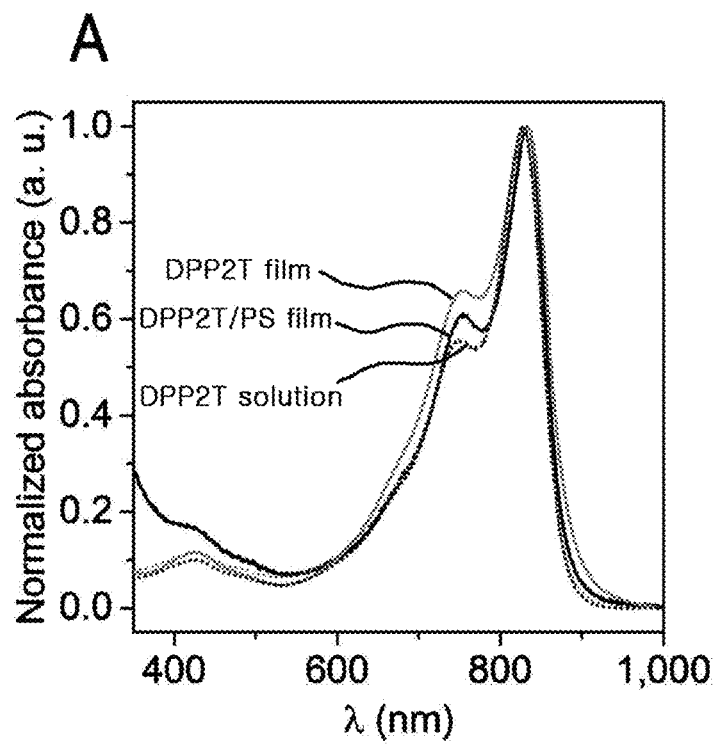
FIGS. 3A and 3B show graphs showing absorbance and transmission spectra of the conjugated polymer and the produced composite polymer according to one embodiment of the present invention.

Referring to FIG. 3, the graphs showing the absorbance and transmission spectra of the conjugated polymer and the composite polymer are disclosed. The graphs showing the absorbance and transmittance spectra of the DPP2T conjugated polymer and the composite polymer produced according to the present invention are compared. FIG. 3A shows absorbance spectra of an original DPP2T polymer and the composite polymer produced according to the present invention. In FIG. 3A, the DPP2T polymer has relatively low absorbance in a visible light range due to an intrinsic absorbance characteristic in an infrared light range as compared with conventional polymer semiconductors. However, owing to a high optical density, the DPP2T polymer has high visible light absorbance even in a thin film of less than 10 nm.

Figure 3B:
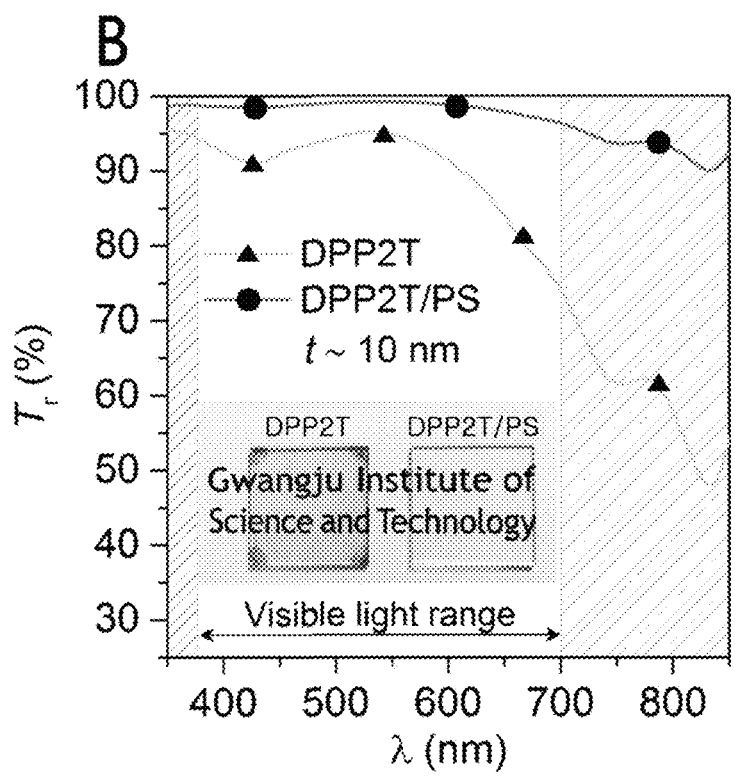

FIG. 3B shows transmittance spectra of the original DPP2T polymer and the composite polymer produced according to present invention. In FIG. 3B, the thin-filmed DPP2T polymer exhibits a vivid green color. Meanwhile, when a thin film is formed using the produced composite polymer, it can be confirmed that transmittance in the range of 95% to 99% is exhibited.

Figure 4:
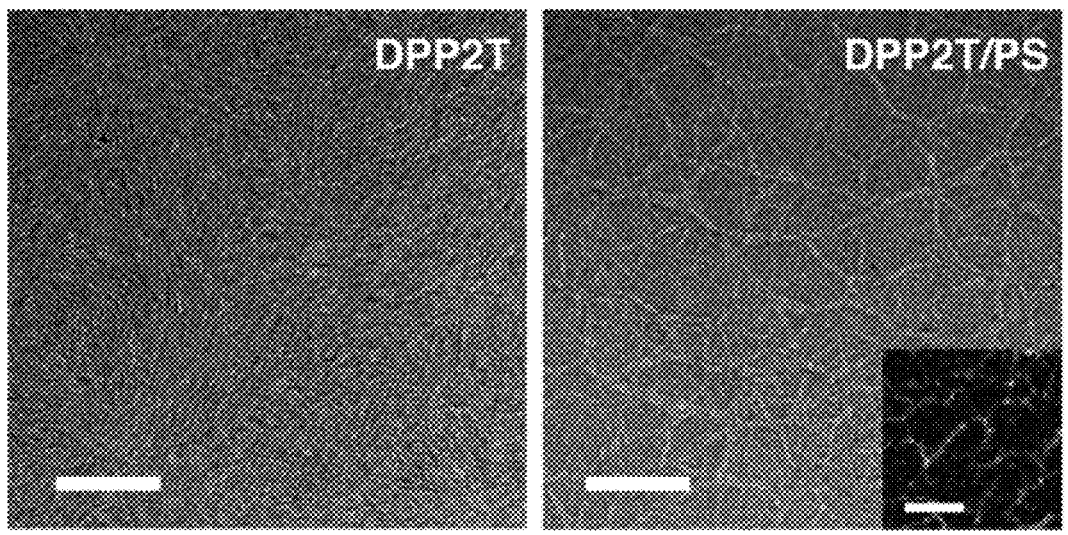
FIG. 4 shows transmission electron microscope (TEM) images of the conjugated polymer and the produced composite polymer according to one embodiment of the present invention.

FIG. 4 shows transmission electron microscope (TEM) images of the conjugated polymer and the produced composite polymer according to one embodiment of the present invention.

Referring to FIG. 4, the TEM images of the conjugated polymer and the produced composite polymer are disclosed.

The TEM images of the DPP2T conjugated polymer and the composite polymer produced according to the present invention are compared.

The DPP2T conjugated polymer has a bundle shape of polymer fibers in which an irregular arrangement of crystal structures and an amorphous structure are mixed. Meanwhile, the produced composite polymer has a repeated nano-mesh shape. Further, an image of the composite polymer exhibited as a green color is a result obtained by analyzing the composite polymer with energy dispersive X-ray spectroscopy (EDS). The sulfur element contained in DPP2T was selectively analyzed and the DPP2T was mapped to a green color. Referring to the disclosed green image, a position of a sulfur element contained in only DPP2T is confirmed. Consequently, it can be confirmed that most of the meshes are constituted of DPP2T in the nano-mesh structure of the produced composite polymer.

Figure 5:
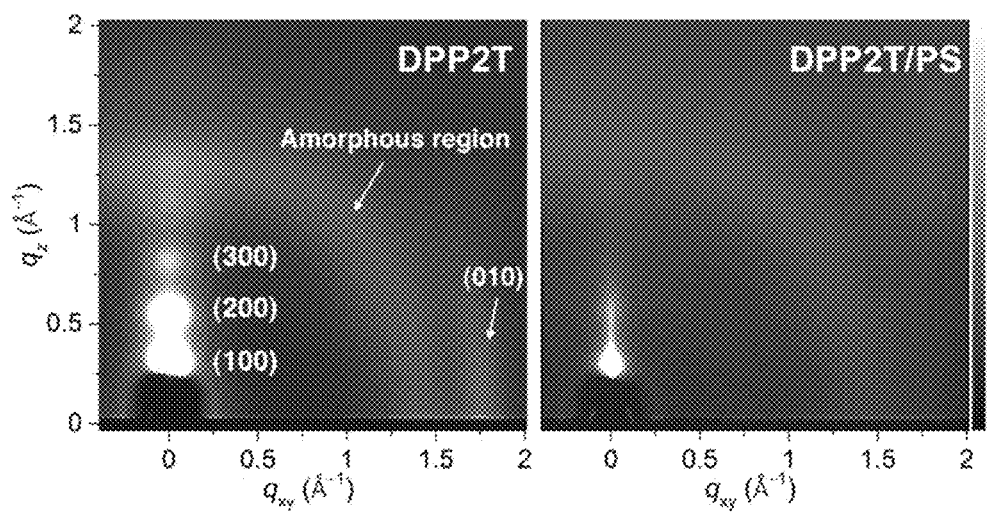
FIG. 5 shows graphs, which are obtained through grazing incidence wide angle X-ray scattering (GIWAXS), showing two-dimensional (2D) structures of the conjugated polymer and the produced composite polymer according to one embodiment of the present invention.

FIG. 5 shows graphs, which are obtained through grazing incidence wide angle X-ray scattering (GIWAXS), showing two-dimensional (2D) structures of the conjugated polymer and the produced composite polymer according to one embodiment of the present invention.

Referring to FIG. 5, the graphs obtained through GIWAXS showing 2D structures of the conjugated polymer and the produced composite polymer are disclosed.

As shown in the graphs obtained through GIWAXS showing the 2D structures, the DPP2T conjugated polymer in which a portion having a complete crystal structure and an irregular crystal structure are mixed can be confirmed. Meanwhile, the produced composite polymer has a small amount of DPP2T forming a fiber structure in the nano-mesh structure, and thus an apparent crystal structure is not exhibited. This is confirmed by the TEM images of FIG. 4 and the graphs obtained through GIWAXS showing the 2D structures of FIG. 5.

FIG. 6 shows graphs showing a transfer characteristic and charge mobility of an FET made of the conjugated polymer and the produced composite polymer according to one embodiment of the present invention.

Referring to FIG. 6, the graphs showing the transfer characteristic and the charge mobility of the FET made of the conjugated polymer and the produced composite polymer are disclosed.

A difference in the molecular arrangement structure confirmed through the GIWAXS structure analysis of FIG. 5 is related to a difference in charge transfer characteristic. Therefore, in order to confirm charge transfer characteristics of the conjugated polymer and the produced composite polymer, the FET including the conjugated polymer and the produced composite polymer thin film is produced.

Figure 6A:
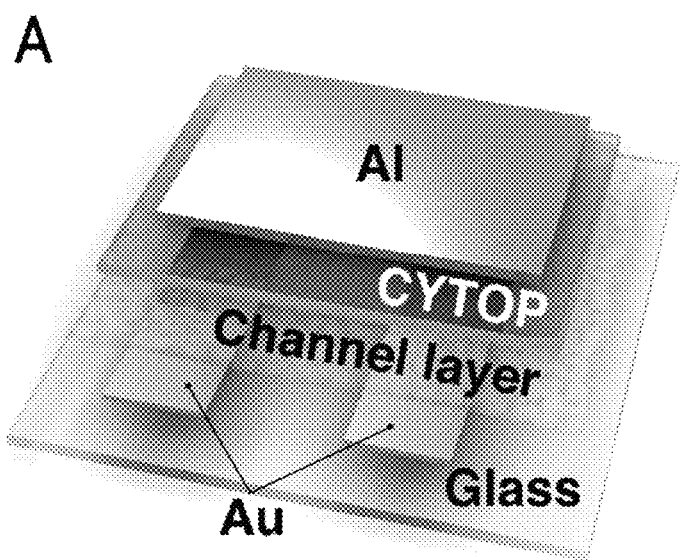
FIGS. 6A to 6C show graphs showing a transfer characteristic and charge mobility of a field effect transistor (FET) made of the conjugated polymer and the produced composite polymer according to one embodiment of the present invention.

FIG. 6A is a structural diagram of the FET.

A substrate is prepared.

Subsequently, an electrode layer is formed on the substrate.

A composite polymer semiconductor layer is formed on the electrode layer.

A gate insulating layer and a gate electrode layer are formed on the composite polymer semiconductor layer.

In particular, the substrate may include a PEN substrate made of a flexible material. Further, except for the substrate, the electrode layer, the composite polymer semiconductor layer, the gate insulating layer, and the gate electrode layer may be formed of polymers. For example, the electrode layer may include PEDOT:PSS and may be formed through ink printing, and the gate insulating layer and the gate electrode layer may be made of amorphous fluorine CYTOP (trade name). In particular, the conjugated polymer and the produced composite polymer may be thin-filmed through a solution process to form the composite polymer semiconductor layer.

Figure 6B:
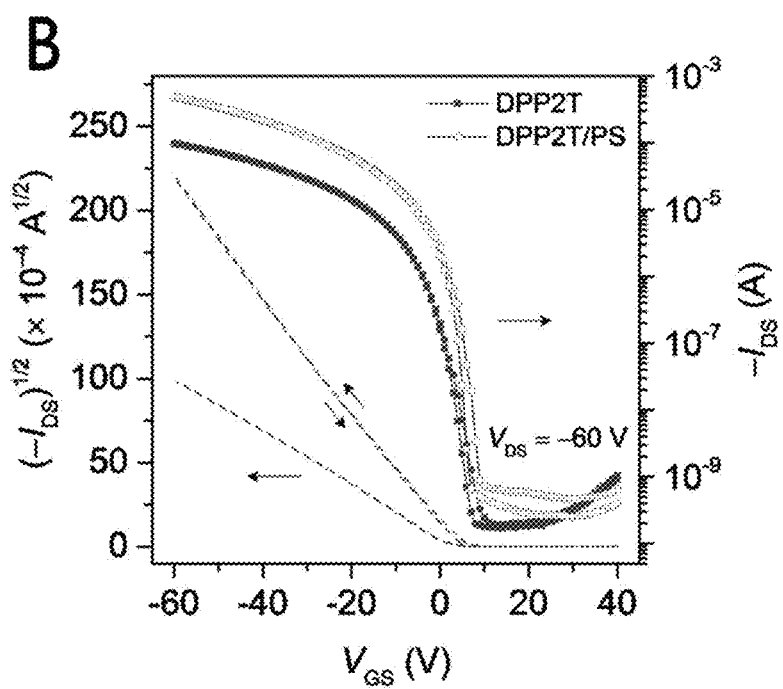

FIG. 6B is a graph showing charge mobility of the FET including the conjugated polymer and the thin film of the produced composite polymer.

The charge mobility of the DPP2T conjugated polymer is confirmed as being in the range of 0.1 cm$^2$/Vs to 1 cm$^2$/Vs. Meanwhile, the charge mobility of the produced composite polymer is confirmed as being in the range of 2.5 cm$^2$/Vs to 3.5 cm$^2$/Vs. It can be confirmed that the produced composite polymer forms the nano-mesh structure such that a width of a channel region in which charges can flow may be reduced than a width of a channel region of the conjugated polymer, but the charge mobility of the device is improved. Therefore, when the channel region of the conjugated polymer and the channel region of the produced composite polymer are converted into a predetermined unit region, it can be seen that the charge mobility of the produced composite polymer is significantly improved to a larger extent than the charge mobility of the conjugated polymer.

Figure 6C:
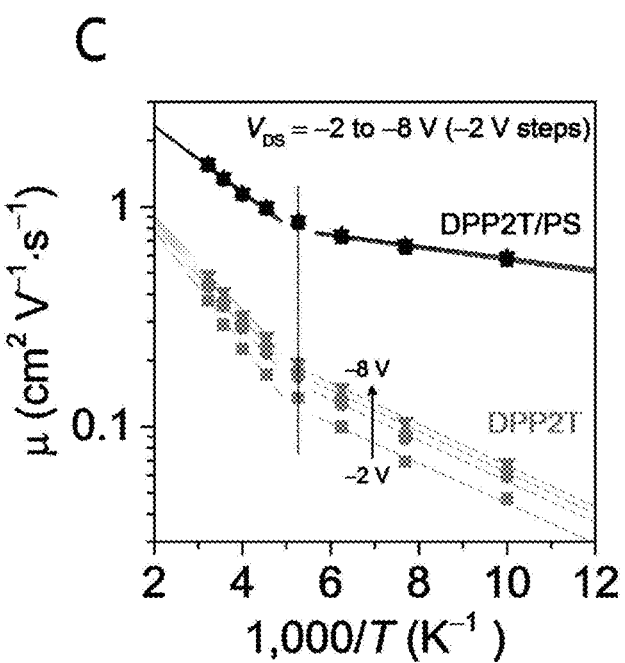

FIG. 6C is a graph showing the charge mobility of the FET including the conjugated polymer and the produced composite polymer according to an electric field and a temperature. Activation energy may be calculated using Arrhenius graphs for the temperature and the charge mobility. The activation energy refers to energy required for activation before charges move. That is, when a channel through which the charges move is regularly formed, it means that the activation energy is small. Further, it can be confirmed that activation energy of the produced composite polymer is 5 meV, which is much smaller than 19 meV activation energy of the conjugated polymer.

Consequently, it can be seen that efficient charge transfer is possible in the nano-mesh structure of the composite polymer mainly formed of DPP2T made of PS rather than the conjugated polymer in which crystalline and the irregular structure coexist. Further, it can be confirmed that as strength of the electric field allowing charges to move decreases, charge mobility in the conjugated polymer decreases, whereas even through the strength of the electric field decreases, charge mobility in the composite polymer is maintained. That is, even when the strength of the electric field increases, it can be confirmed that the produced composite polymer having the mesh structure allows charges to move easily due to the formation of an effective charge transfer channel.

FIG. 7 shows graphs showing transmittance and a transfer characteristic of a transparent FET which includes the composite polymer according to one embodiment of the present invention and in which all layers are made of polymers.

Referring to FIG. 7, the graphs showing the transmittance and the transfer characteristic of the transparent FET, which includes the composite polymer and in which all the layers are made of polymers, are disclosed.

Figure 7A:
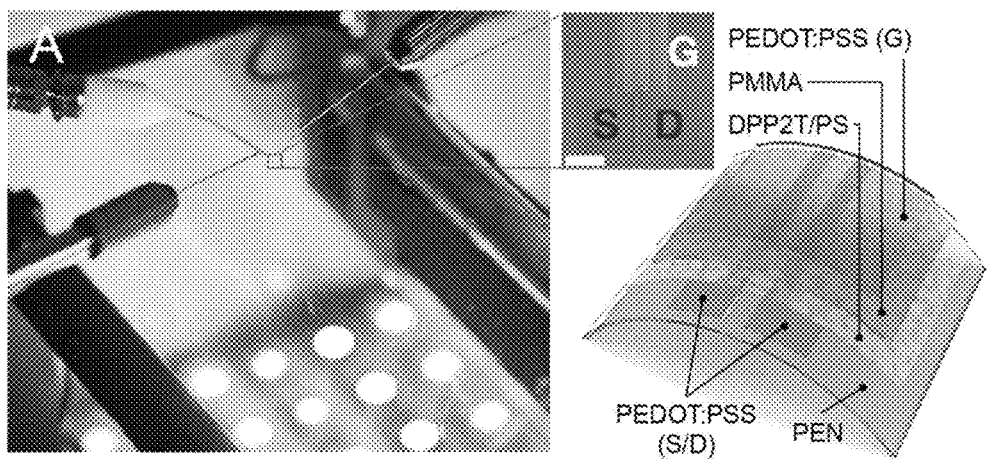
FIGS. 7A to 7C show graphs showing transmittance and a transfer characteristic of a transparent FET which includes the composite polymer according to one embodiment of the present invention and in which all layers are made of polymers.
Figure 7B:
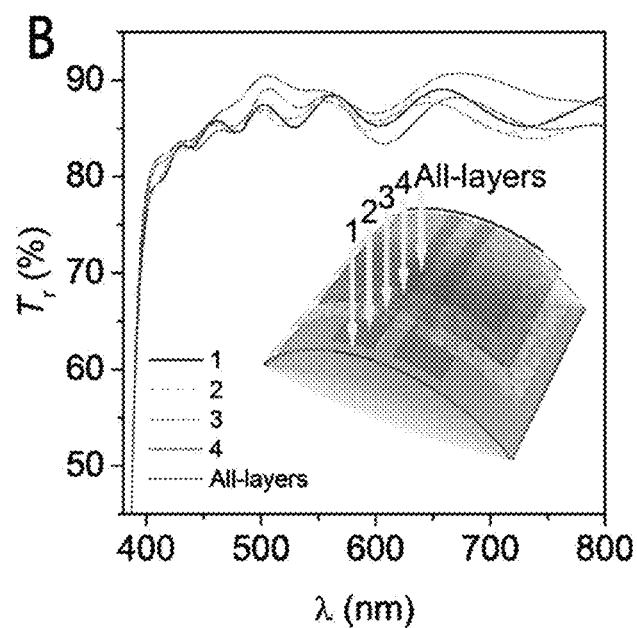
Figure 7C:
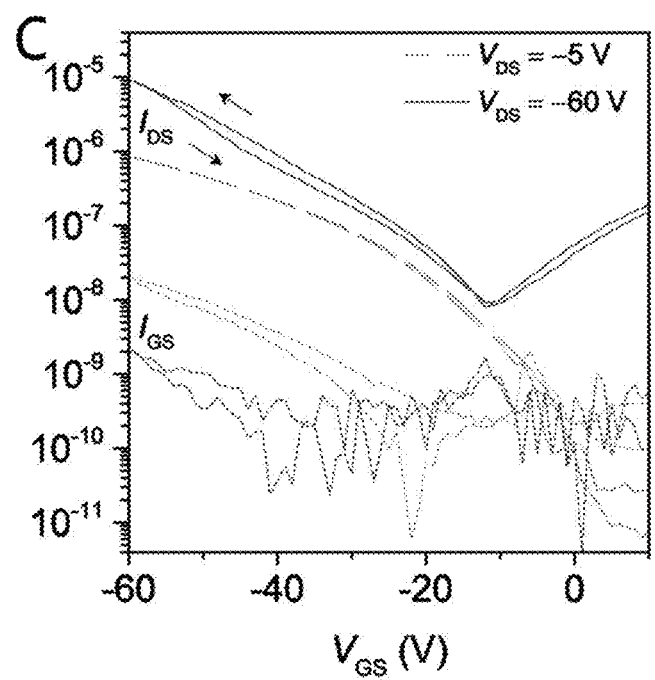

FIG. 7A illustrates a transparent FET array which includes the composite polymer and in which all the layers are made of polymers. Further, in order to prepare a transparent electrode, PEDOT:PSS, which is a conductive polymer material, is printed in an ink-jet manner such that the transparent FET array, in which all the layers are made of polymers undergoing a solution process, is implemented. Four layers including an electrode, an insulator film, and a composite polymer are formed on a flexible poly(ethylene-2,6-naphthalte) (PEN) substrate. Further, an element capable of maintaining transmittance of the flexible PEN substrate is implemented. FIGS. 7B and 7C are graphs showing charge mobility of the transparent FET including a composite polymer layer. It can be confirmed that charge mobility of the transparent FET including the composite polymer layer has a characteristic of high charge mobility in the range of 0.8 cm$^2$/Vs to 1 cm$^2$/Vs.

FIG. 8 shows graphs showing a characteristic of an FET-polymer light-emitting diode (PLED) junction device according to one embodiment of the present invention.

Referring to FIG. 8, the graphs showing the characteristic of the FET-PLED junction device are disclosed.

Figure 8A:
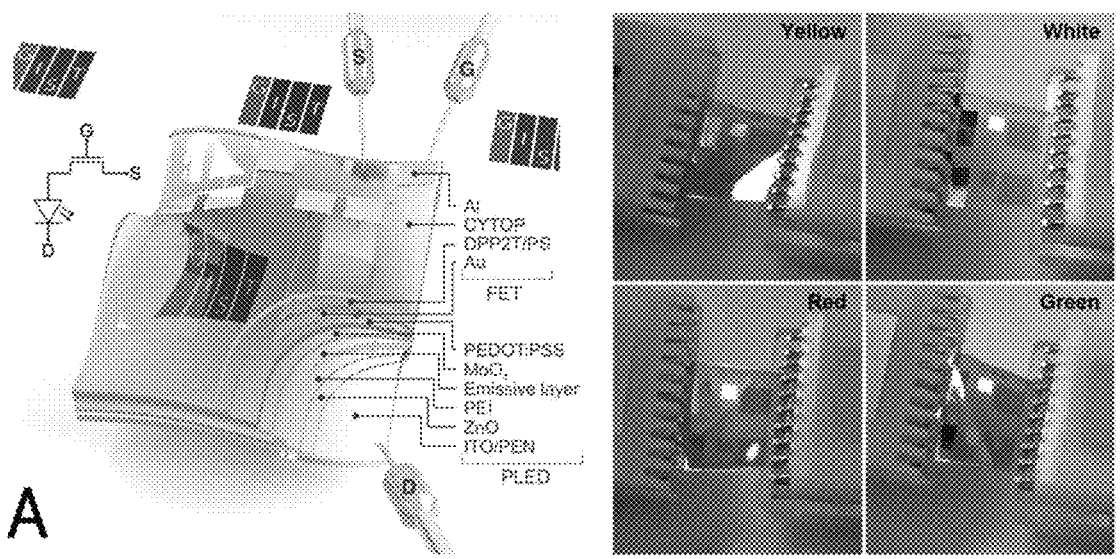
FIGS. 8A to 8C show graphs showing a characteristic of an FET-polymer light-emitting diode (PLED) junction device according to one embodiment of the present invention.

FIG. 8A shows photographs showing a structure and driving of the FET-PLED junction device.

Figure 8B:
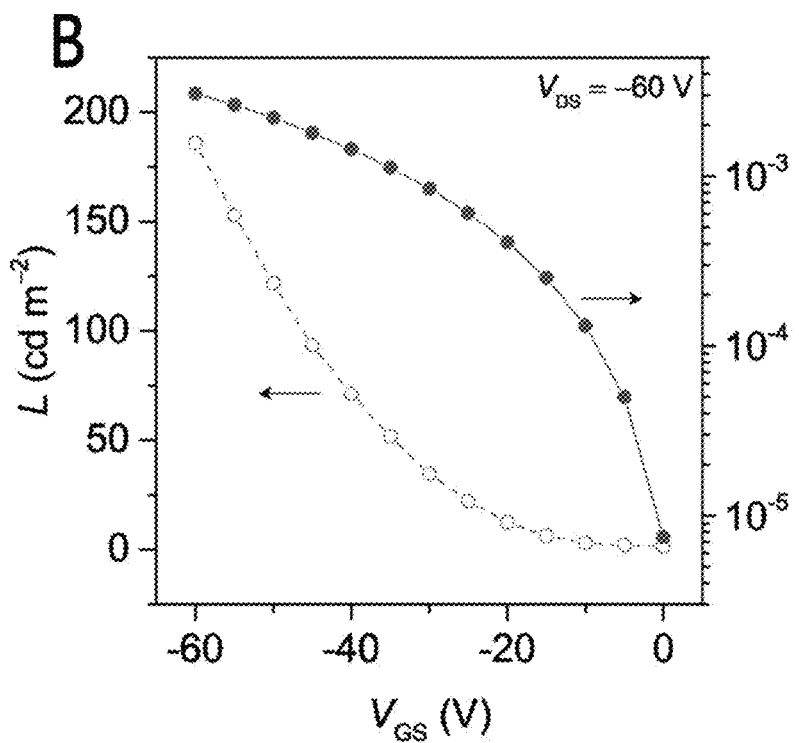
Figure 8C:
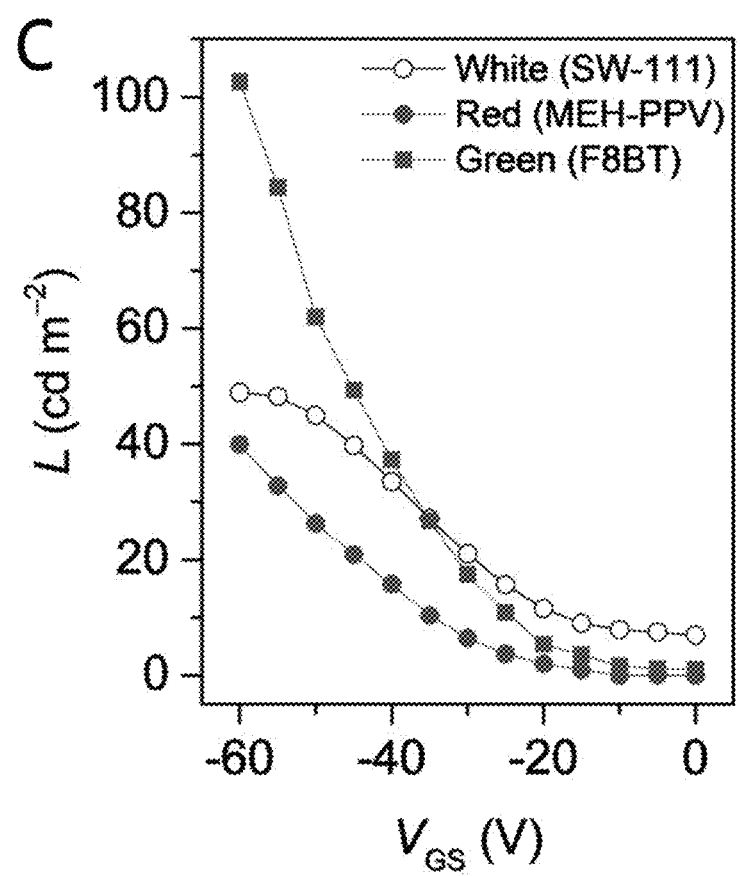

Through the graph showing the characteristic of the FET-PLED junction device, it can be confirmed that a space is reduced by directly stacking the transparent FET on the PLED and, at the same time, even when a spectrum of light emitted from the PLED passes through the transparent FET, most of the spectrum of light emitted from the PLED is maintained. FIG. 8B is a graph showing an I-V-L characteristic of an FET-PLED of a yellow color. Further, FIG. 8C is a graph showing L-V characteristics of FET-PLEDs of various colors. Through the graphs showing the characteristics of the FET-PLEDs of FIGS. 8B and 8C, it can be seen that it is possible to effectively control light of the PLED by adjusting a current flowing to the FET. Further, the FET-PLED junction device may be effectively implemented using various light emission materials.

Therefore, according to a manufacturing method of mixing a conjugated polymer and an insulating polymer, a composite polymer having a mesh structure can be produced using a solution process and combining the insulating polymer to the conjugated polymer with a mass ratio in the range of 70:30 to 95:5. The produced composite polymer can improve charge mobility. Further, since a small amount of the conjugated polymer is introduced into the insulating polymer, it is possible to minimize absorbance of visible light such that a transparent and flexible organic electronic device having high economic feasibility can be produced.

The invention claimed is:

1. A composite polymer semiconductor comprising:
   an insulating polymer layer configured to form a matrix; and
   a conjugated polymer layer coexisting with the insulating polymer layer and formed with a fiber structure having a regular molecular arrangement in a mesh shape;
   wherein the conjugated polymer layer is made of DPP2T and the insulating polymer layer is made of polystyrene (PS).

2. The composite polymer semiconductor of claim 1, wherein the insulating polymer layer and the conjugated polymer layer are mixed with a mass ratio (%) in the range of 70:30 to 95:5 and are thin-filmed through a solution process.

3. The composite polymer semiconductor of claim 2, wherein the thin-filmed composite polymer has transmittance in the range of 95% to 99%.

* * * * *